United States Patent
Fain et al.

(10) Patent No.: US 6,198,960 B1
(45) Date of Patent: Mar. 6, 2001

(54) FLIP ANGLE MODULATED MAGNETIC RESONANCE ANGIOGRAPHY

(75) Inventors: Sean B. Fain; Stephen J. Riederer, both of Rochester, MN (US)

(73) Assignee: Mayo Foundation for Medical Education and Research, Rochester, MN (US)

(*) Notice: Subject to any disclaimer, the term of this patent is extended or adjusted under 35 U.S.C. 154(b) by 0 days.

(21) Appl. No.: 09/198,758

(22) Filed: Nov. 24, 1998

(51) Int. Cl.⁷ ................................................ A61B 5/055
(52) U.S. Cl. .................... 600/419; 600/420; 324/306; 324/309
(58) Field of Search ................................ 600/419, 420; 324/306, 307, 309

(56) References Cited

U.S. PATENT DOCUMENTS

| Re. 32,701 | 6/1988 | Moran | 324/309 |
|---|---|---|---|
| 5,122,747 | 6/1992 | Riederer et al. | 324/309 |
| 5,337,749 * | 8/1994 | Shimizu | 600/419 |
| 5,417,213 | 5/1995 | Prince | 128/653.3 |
| 5,924,987 * | 7/1999 | Meaney et al. | 600/420 |

OTHER PUBLICATIONS

Fluoroscopically Triggered Contrast–Enhanced Three–Dimensional MR Angiography with Elliptical Centric View Order: *Application to the Renal Arteries,* Radiology 1997; 205: 137–146, Wilman, et al.

* cited by examiner

*Primary Examiner*—Ruth S. Smith
(74) *Attorney, Agent, or Firm*—Quarles & Brady, LLP

(57) ABSTRACT

A dynamic MRA study of a subject is performed using a 3D fast gradient-recalled echo pulse sequence after the subject is injected with a contrast agent. The flip angle of an rf excitation pulse in the pulse sequence is modulated during the acquisition as a function of contrast agent concentration in the region of interest. In one embodiment the flip angle is updated by interleaving measurement pulse sequences which measure in real-time contrast agent concentration. In another embodiment the contrast concentration profile is determined in advance and a corresponding table of optimal flip angles are calculated and played out during the image acquisition.

11 Claims, 6 Drawing Sheets

FIG. 1 *Prior Art*

FLIP ANGLE MODULATED MAGNETIC RESONANCE ANGIOGRAPHY

BACKGROUND OF THE INVENTION

The field of the invention is magnetic resonance angiography ("MRA"), and particularly, dynamic studies of the human vasculature using contrast agents which enhance the NMR signals.

Diagnostic studies of the human vasculature have many medical applications. X-ray imaging methods such as digital subtraction angiography ("DSA") have found wide use in the visualization of the cardiovascular system, including the heart and associated blood vessels. Images showing the circulation of blood in the arteries and veins of the kidneys and the carotid arteries and veins of the neck and head have immense diagnostic utility. Unfortunately, however, these x-ray methods subject the patient to potentially harmful ionizing radiation and often require the use of an invasive catheter to inject a contrast agent into the vasculature to be imaged.

Magnetic resonance angiography (MRA) uses the nuclear magnetic resonance (NMR) phenomenon to produce images of the human vasculature. When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins, and after the excitation signal $B_1$ is terminated, this signal may be received and processed to form an image.

When utilizing these signals to produce images, magnetic field gradients ($G_x$ $G_y$ and $G_z$) are employed. Typically, the region to be imaged is scanned by a sequence of measurement cycles in which these gradients vary according to the particular localization method being used. Each measurement is referred to in the art as a "view" and the number of views determines the resolution of the image. The resulting set of received NMR signals, or views, are digitized and processed to reconstruct the image using one of many well known reconstruction techniques. The total scan time is determined in part by the number of measurement cycles, or views, that are acquired for an image, and therefore, scan time can be reduced at the expense of image resolution by reducing the number of acquired views.

MR angiography (MRA) has been an active area of research. Two basic techniques have been proposed and evaluated. The first class, time-of-flight (TOF) techniques, consists of methods which use the motion of the blood relative to the surrounding tissue. The most common approach is to exploit the differences in signal saturation that exist between flowing blood and stationary tissue. The improvement in blood-tissue contrast is due to the stationary tissues experiencing many excitation pulses and becoming saturated. Flowing blood, which is moving through the excited section, is continually refreshed by spins experiencing fewer excitation pulses and is, therefore, less saturated. The result is the desired image contrast between the high-signal blood and the low-signal stationary tissues.

MR methods have also been developed that encode motion into the phase of the acquired signal as disclosed in U.S. Pat. No. Re. 32,701. These form the second class of MRA techniques and are known as phase contrast (PC) methods. Currently, most PC MRA techniques acquire two images, with each image having a different sensitivity to the same velocity component. Angiographic images are then obtained by forming either the phase or complex difference between the pair of velocity-encoded images. Phase contrast MRA techniques have been extended so that they are sensitive to velocity components in all three orthogonal directions.

More widespread application of either TOF or PC MRA techniques is hampered by the presence of a variety of deleterious image artifacts, which can mask and, in some cases, even mimic pathology. These artifacts generally result in a lower specificity, as well as compromised sensitivity.

To enhance the diagnostic capability of MRA a contrast agent such as gadolinium can be injected into the patient prior to the MRA scan. As described in U.S. Pat. No. 5,417,213 the trick is to acquire the central k-space views at the moment the bolus of contrast agent is flowing through the vasculature of interest. This is not an easy timing to achieve as part of a routine clinical procedure because the delay time between intravenous injection to arrival in the arterial vasculature of interest is highly patient-dependent. Therefore, some means is required for determining this delay time and synchronizing MR data acquisition to the contrast bolus profile. Such synchronization is necessary to provide adequate vessel contrast and to prevent artifacts such as edge enhancement of the vessel. Various means have been developed to provide accurate timing including: use of a small test injection of contrast as described by J. K. Kim, R. I. Farb, and G. A. Wright, *Test Bolus Examination in the Carotid Artery at Dynamic Gadolinium-enhanced MR Angiography*, Radiology, 1998, 206:283–289, real-time line scanning described by T. K. Foo, S. Manojkumar, M. R. Prince, and T. L. Chenevert, *Automated Detection of Bolus Arrival and Initiation of Data Acquisition in Fast, Three-dimensional, Gadolinium-enhanced MR Angiography*, Radiology 1997, 205:137–146, real-time fluoroscopic imaging as described by A. H. Wilman, S. J. Riederer, B. R. King, J. P. Debbins, P. J. Rossman, R. L. Ehman, *Fluoroscopically Triggered Contrast-Enhanced Three-dimensional MR Angiography with Elliptical Centric View Order: Application to the Renal Arteries*", Radiology 1997, 205:137–146.

The in vivo contrast enhancement profile provided by the passage of a contrast agent bolus closely matches a gamma-variate function as described by the general equation:

$$C(t) = A t e^{-t/\tau}.$$

As shown in FIG. 4, as a result of the contrast agent passage the acquired NMR signal is enhanced considerably for a short time interval and then the enhancement tapers off. Consequently, even if the MR acquisition is accurately synchronized to the contrast bolus, only a small number of views (usually the central k-space views) are acquired while the T1 shortening associated with high contrast agent concentration is at its peak. The bulk of the image is acquired while contrast concentration is decreasing and T1 time is increasing.

The measured signal intensity due to a series of equally spaced radio frequency (rf) pulses can be described by the following equation for the transverse magnetization that is produced:

$$M_{xy} = \frac{\sin(\alpha)(1 - e^{-TR/T1})}{(1 - \cos(\alpha)e^{-TR/T1})}$$

The flip angle α, which maximizes the measured signal is termed the "Ernst" angle. Non-contrast enhanced gradient recalled echo (GRE) imaging uses flip angles set deliberately near the Ernst angle of the spins being imaged to increase the T1-weighted contrast. This angle is expressed quantitatively as:

$$\alpha_E = \cos^{-1}(e^{-TR/T1}).$$

Typically, the flip angle is fixed at this value for acquisition of the complete NMR data set.

SUMMARY OF THE INVENTION

The present invention is a method for acquiring MRA data during a contrast enhanced dynamic study in which a scan parameter is modulated as a function of the changing contrast agent enhancement profile C(t). More particularly, the invention includes injecting a patient with a contrast agent that flows into a region of interest to be imaged with an MRI system, acquiring image data from the region of interest with which an image is reconstructed, and modulating the flip angle of an rf excitation pulse during the acquisition of image data as a function of the contrast agent concentration in the region of interest.

In one embodiment a contrast agent measurement pulse sequence is performed to determine when the contrast agent arrives in the region of interest and to measure the concentration level throughout the acquisition. The contrast agent measurement pulse sequence is interleaved with the image pulse sequence, and each contrast agent concentration measurement is employed to calculate an optimal flip angle that is used in subsequent image data acquisitions.

In another embodiment a model of the contrast agent concentration profile is determined in advance of the scan for the vasculature of interest. When the arrival of contrast agent in the region of interest is detected, this model is used to determine the optimal flip angle to be used throughout the image acquisition.

A general object of the invention is to improve the quality of an MRA image acquired during a dynamic study. By using the optimal flip angle throughout the acquisition, the best possible NMR image signal is acquired throughout. Since the periphery of k-space is often acquired under less than optimal conditions, the present invention improves the NMR signals sampled from the periphery of k-space and hence improves the clarity of fine details in the reconstructed image.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

GENERAL DESCRIPTION OF THE INVENTION

Contrast enhancement occurs when contrast agent carried by moving blood enters the region of interest being imaged. This enhancement occurs because the contrast agent changes the $T_1$ relaxation constant of spins flowing through the vasculature. The effective $T_1$ is thus a function of the relaxivity (R) of the contrast agent and its concentration (C) in the blood:

$$\frac{1}{T_1} = \frac{1}{T_1 Blood} + R \cdot C. \tag{1}$$

As indicated above, the optimal flip angle is the Ernst angle:

$$\alpha_E = \cos^{-1}(e^{-TR/T^1}) \tag{2}$$

where TR is the pulse repetition rate and $T_1$ is the relaxation constant according to equation (1).

Figure 5:
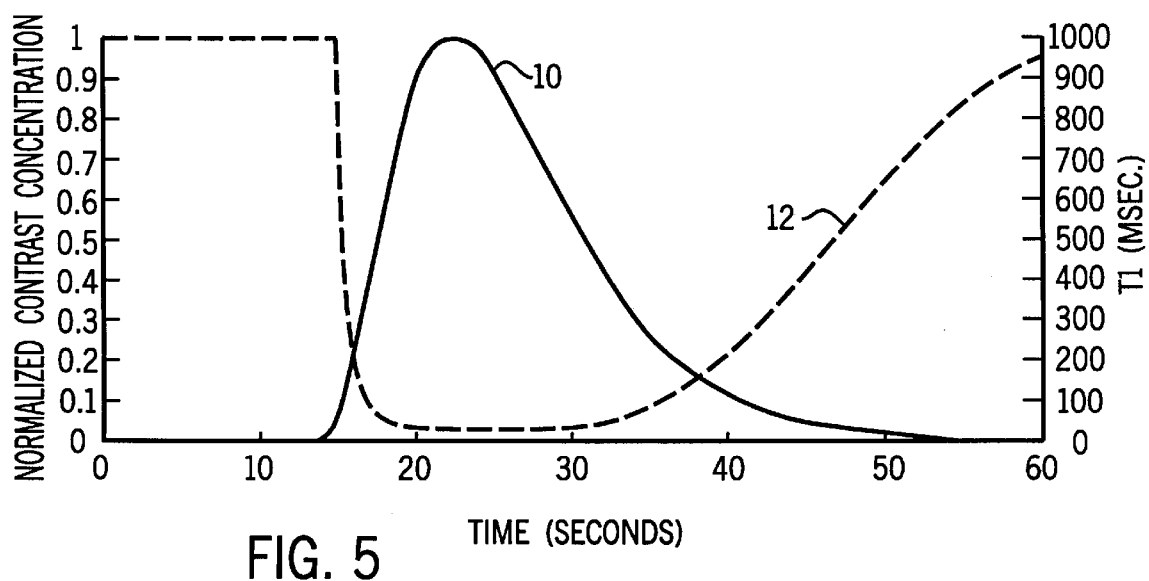
FIG. 5 is a graphic representation of a contrast agent enhancement profile and the resulting effect on $T_1$ relaxation constant.

The present invention is based on the realization that the concentration of the contrast agent varies as a function of time (C(t)) during the scan, and that this causes the effective $T_1$ to also vary as a function of time ($T_1$(t)). This is illustrated in FIG. 5, where the curve 10 is an exemplary normalized contrast concentration profile C(t), and the curve 12 is the corresponding variation in the effective relaxation time $T_1$(t):

$$\frac{1}{T_1(t)} = \frac{1}{T_1 Blood} + R \cdot C(t). \tag{3}$$

To optimize the signal enhancement throughout the scan, it is a teaching of the present invention that the flip angle (α) of the rf excitation pulse be modulated as a function of time to account for the changing relaxation time $T_1$(t). In the preferred embodiment the flip angle is maintained at the Ernst angle:

$$\alpha_E(t) = \cos^{-1}(e^{-TR/T^1(t)}), \tag{4}$$

where $T_1$(t) is calculated according to equation (3) above.

There are two techniques for implementing the invention. With the first technique the normalized contrast concentration is calculated in real-time as the image data is being acquired. A contrast measurement pulse sequence is interleaved with the acquisition of image views and an updated flip angle value is calculated using the measured contrast concentration. The flip angle used to acquire image data is thus periodically updated during the scan to optimize the signal enhancement.

A second technique for implementing the present invention is to create a model of the contrast concentration curve for the particular vasculature being imaged and use that model to modulate the flip angle during a subsequent image acquisition. In one embodiment, for example, the contrast concentration curve for the carotid arteries was modeled and used to create a table of corresponding flip angles. When the arrival of the bolus is detected during a scan of a patient's carotid artery, the table of flip angles is played out as a function of time by using the stored flip angles to acquire image data.

Figure 6:
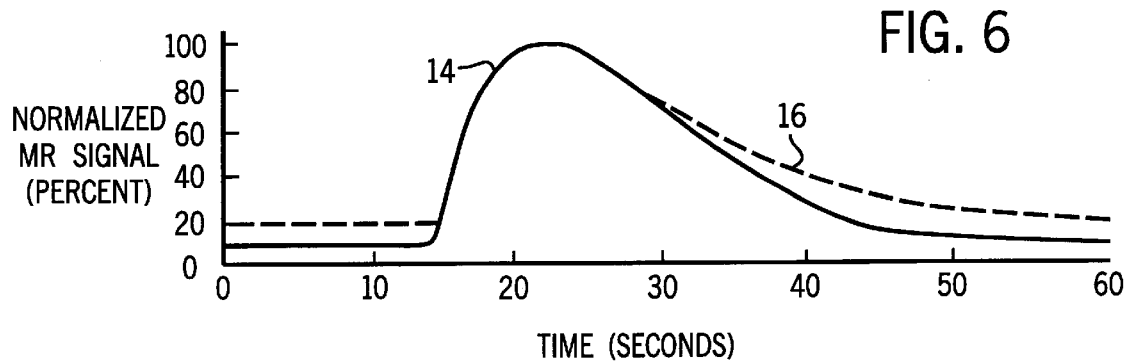
FIG. 6 is a graphic representation of the enhanced NMR signal with and without the present invention.

With either technique a significant improvement in signal enhancement is achieved by modulating the flip angle during the dynamic study. As shown in FIG. 6, the enhancement to the acquired NMR signals as a function of time when a fixed flip angle is used is shown by the solid line 14. When the present invention is used the signal enhancement is improved as indicated by dashed line 16. The improvement in the acquired NMR signal is particularly important late in the acquisition when the normalized concentration curve tapers off. Since the peripheral region of k-space is usually sampled during this later time, the signal quality is improved and detailed information is more accurately depicted in the reconstructed image.

DESCRIPTION Of THE PREFERRED EMBODIMENT

Figure 1:
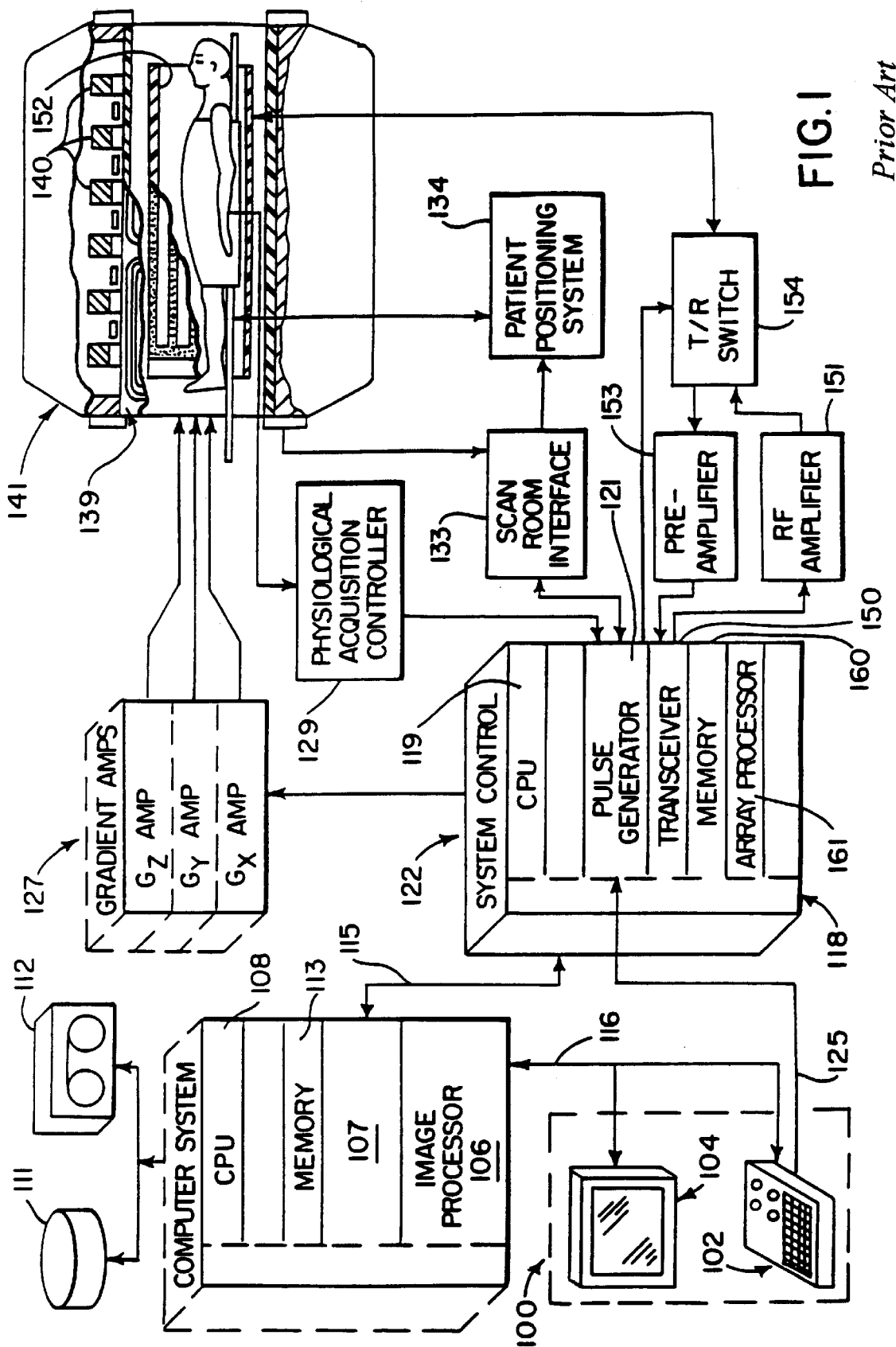
FIG. 1 is a block diagram of an MRI system which has been modified to practice the preferred embodiment of the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane 118. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan parameters of the prescribed sequence that is to be performed. The pulse generator module 121 operates the system components in accordance with the scan parameters to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 2:
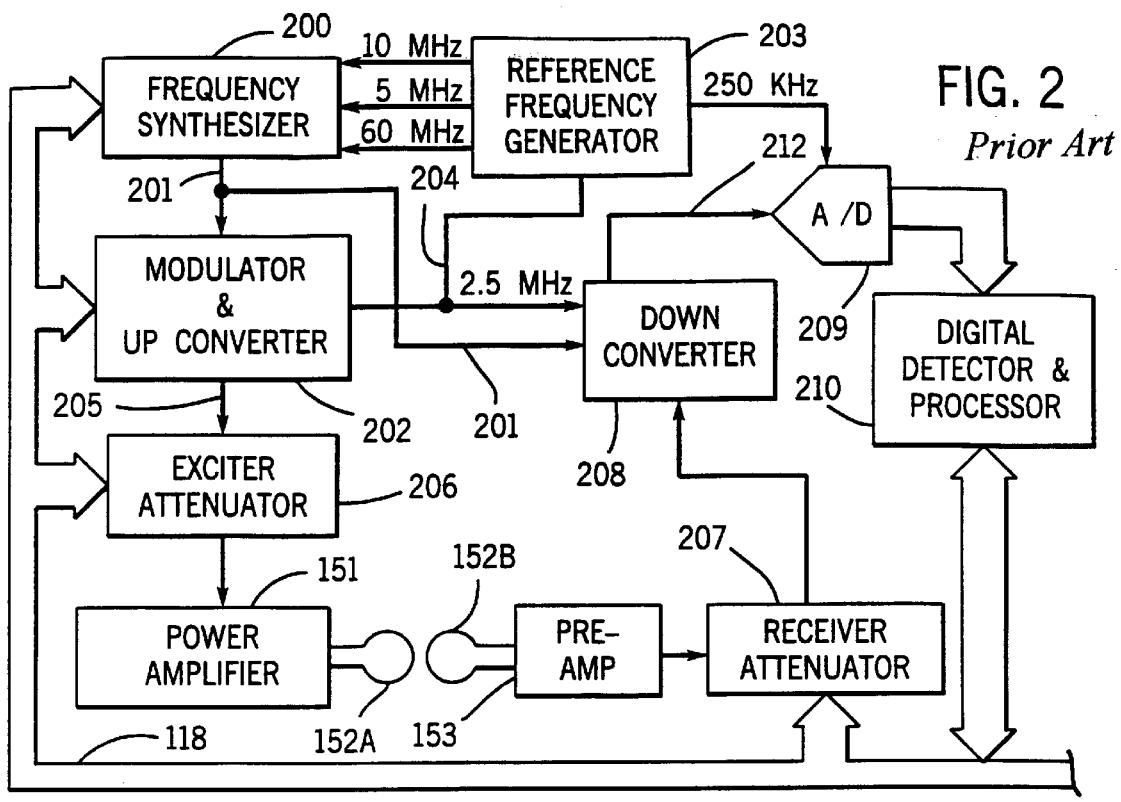
FIG. 2 is an electrical block diagram of the transceiver which forms part of the modified MRI system of FIG. 1.

Referring particularly to FIGS. 1 and 2, the transceiver 150 produces the RF excitation field B1 through power amplifier 151 at a coil 152A and receives the resulting signal induced in a coil 152B. As indicated above, the coils 152A and B may be separate as shown in FIG. 2, or they may be a single wholebody coil as shown in FIG. 1. The base, or carrier, frequency of the RF excitation field is produced under control of a frequency synthesizer 200 which receives a set of digital signals from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal S(t) also received from the pulse generator module 121. The signal S(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command, from the backplane 118. The attenuated RF excitation pulses are applied to the power amplifier 151 that drives the RF coil 152A. As will be described in more detail below, one aspect of the present invention is to modulate the flip angle produced by the RF excitation pulse during the scan by changing this digital command. For a more detailed description of this portion of the transceiver 122, reference is made to U.S. Pat. No. 4,952,877 which is incorporated herein by reference.

Referring still to FIGS. 1 and 2 the signal produced by the subject is picked up by the receiver coil 152B and applied through the preamplifier 153 to the input of a receiver attenuator 207. The receiver attenuator 207 further amplifies the signal by an amount determined by a digital attenuation signal received from the backplane 118.

The received signal is at or around the Larmor frequency, and this high frequency signal is down converted in a two step process by a down converter 208 which first mixes the NMR signal with the carrier signal on line 201 and then mixes the resulting difference signal with the 2.5 MHZ reference signal on line 204. The down converted NMR signal is applied to the input of an analog-to-digital (A/D) converter 209 which samples and digitizes the analog signal and applies it to a digital detector and signal processor 210 which produces 16-bit in-phase (I) values and 16-bit quadrature (Q) values corresponding to the received signal. The resulting stream of digitized I and Q values of the received signal are output through backplane 118 to the memory module 160 where they are employed to reconstruct an image.

The 2.5 MHZ reference signal as well as the 250 KHz sampling signal and the 5, 10 and 60 MHZ reference signals are produced by a reference frequency generator 203 from a common 20 MHZ master clock signal. For a more detailed description of the receiver, reference is made to U.S. Pat. No. 4,992,736 which is incorporated herein by reference.

Figure 3:
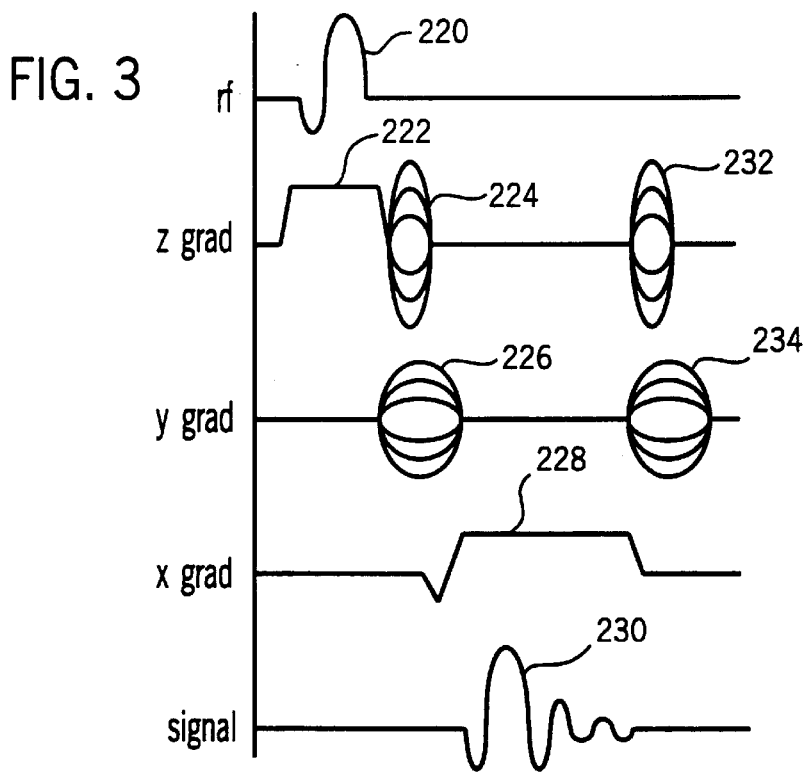
FIG. 3 is a graphic representation of the imaging pulse sequence employed in the preferred embodiment of the invention.
Figure 4:
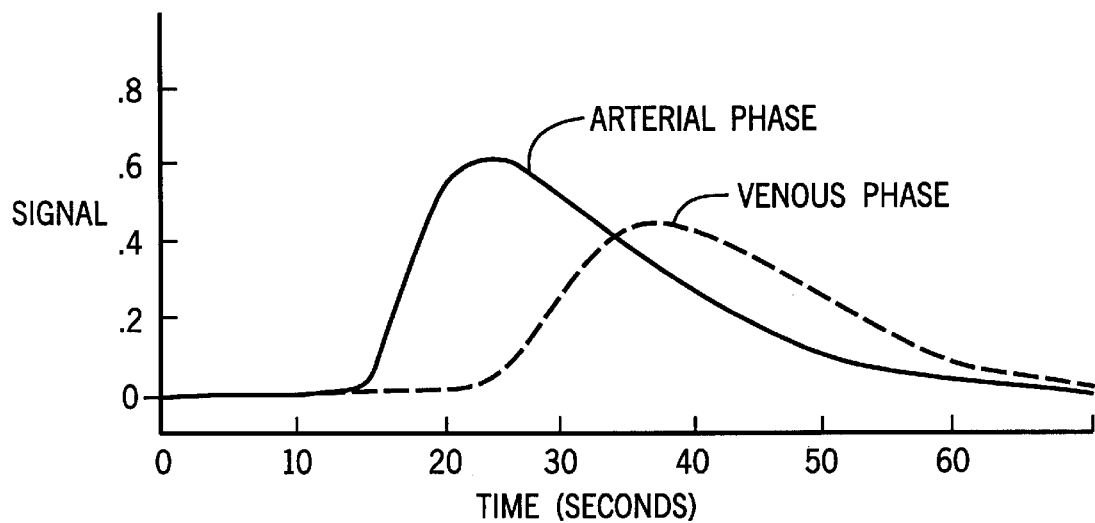
FIG. 4 is a graphic representation of typical contrast agent enhancement profiles during the arterial phase and venous phase of bolus arrival.

Although the present invention can be used with a number of different pulse sequences, the preferred embodiment of the invention employs a 3D gradient recalled echo pulse sequence depicted in FIG. 3. The pulse sequence "3dfgre" available on the General Electric 1.5 Tesla MR scanner sold under the trademark "SIGNA" with revision level 5.5 system software was used.

Referring particularly to FIG. 3, an RF excitation pulse 220 is produced in the presence of a slab select gradient pulse 222 to produce transverse magnetization in the 3D volume of interest as taught in U.S. Pat. No. 4,431,968. This is followed by a phase encoding gradient pulse 224 directed along the z axis and a phase encoding gradient pulse 226 directed along the y axis. A readout gradient pulse 228 directed along the x axis follows and a partial echo (60%) NMR signal 230 is acquired and digitized as described above. After the acquisition, rewinder gradient pulses 232 and 234 rephase the magnetization before the pulse sequence is repeated as taught in U.S. Pat. No. 4,665,365.

As is well known in the art, the pulse sequence is repeated and the phase encoding pulses 224 and 226 are stepped through a series of values to sample the 3D k-space. In the preferred embodiment 32 phase encodings are employed along the z axis and 192 phase encodings are employed along the y axis. For each particular y phase encoding, therefore, 32 acquisitions with 32 different z phase encodings are performed to sample completely along the $k_z$ axis. This is repeated 192 times with 192 different y phase encodings to sample completely along the $k_y$ axis.

Sampling along the $k_x$ axis is performed by sampling the echo signal 230 in the presence of the readout gradient pulse 228 during each pulse sequence. It will be understood by those skilled in the art that only a partial sampling along the $k_x$ axis is performed and the missing data is computed using a homodyne reconstruction or by zero filling. This enables the echo time (TE) of the pulse sequence to be shortened to less than 1.8 to 2.0 ms. and the pulse repetition rate (TR) to be shortened to less than 10.0 msecs.

A centric view order is used in the preferred embodiment to acquire a complete 3D k-space data set. More particularly, the spiral sampling of k-space as described in U.S. Pat. No. 5,122,747 is used. As described in this patent, which is incorporated herein by reference, the phase encoding gradients are stepped through values which sample 3D k-space starting at its center and working outward in a single spiral path. As a result, the central region of k-space is sampled first and the peripheral region is sampled last. The acquired 3D k-space is then used to reconstruct an image by performing a Fourier transformation along each of its three axes.

For assessing overall blood vessel structure and health it is usually more useful to project the 3D array of image data into a single 2D projection image. The most commonly used technique for doing this is to project a ray from each pixel in the 2D projection image through the 3D array of image data points and select the data point which has the maximum value. The value selected for each ray is used to control the brightness of its corresponding pixel in the 2D projection image. This method, referred to as the "maximum pixel technique," is very easy to implement and it gives aesthetically pleasing images. It is presently the preferred method.

As indicated above the views used to form the 3D k-space data set are acquired over a period of time during which contrast agent is flowing into the region of interest ("ROI"). As a result, the amount of contrast agent, and hence the effective $T_1$ of the blood flowing through the ROI will change during the acquisition of the views used to form the image data set.

The present invention is implemented by modulating the flip angle of the rf excitation pulse 220 during the acquisition of the image data set to optimize the magnitude of the NMR signal acquired during each sampling of k-space. Two techniques for controlling this modulation to correspond with the changing contrast agent concentration have been developed. The first technique measures the contrast agent concentration in real-time as the dynamic study is being conducted and calculates the optimal flip angle to be used. The second technique creates a model of the contrast concentration curve and uses that model to modulate the flip angle as the dynamic study is being conducted.

Real-Time Flip Angle Modulation

Figure 8:
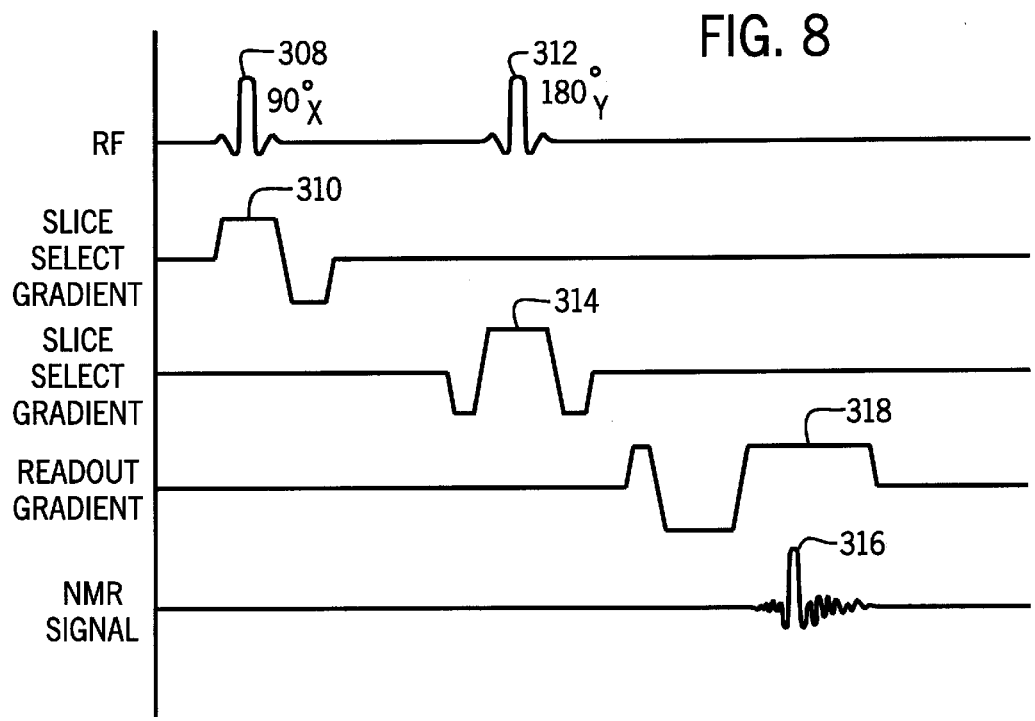
FIG. 8 is a graphic representation of a contrast concentration measurement pulse sequence used in the method of FIG. 7.
Figure 7:
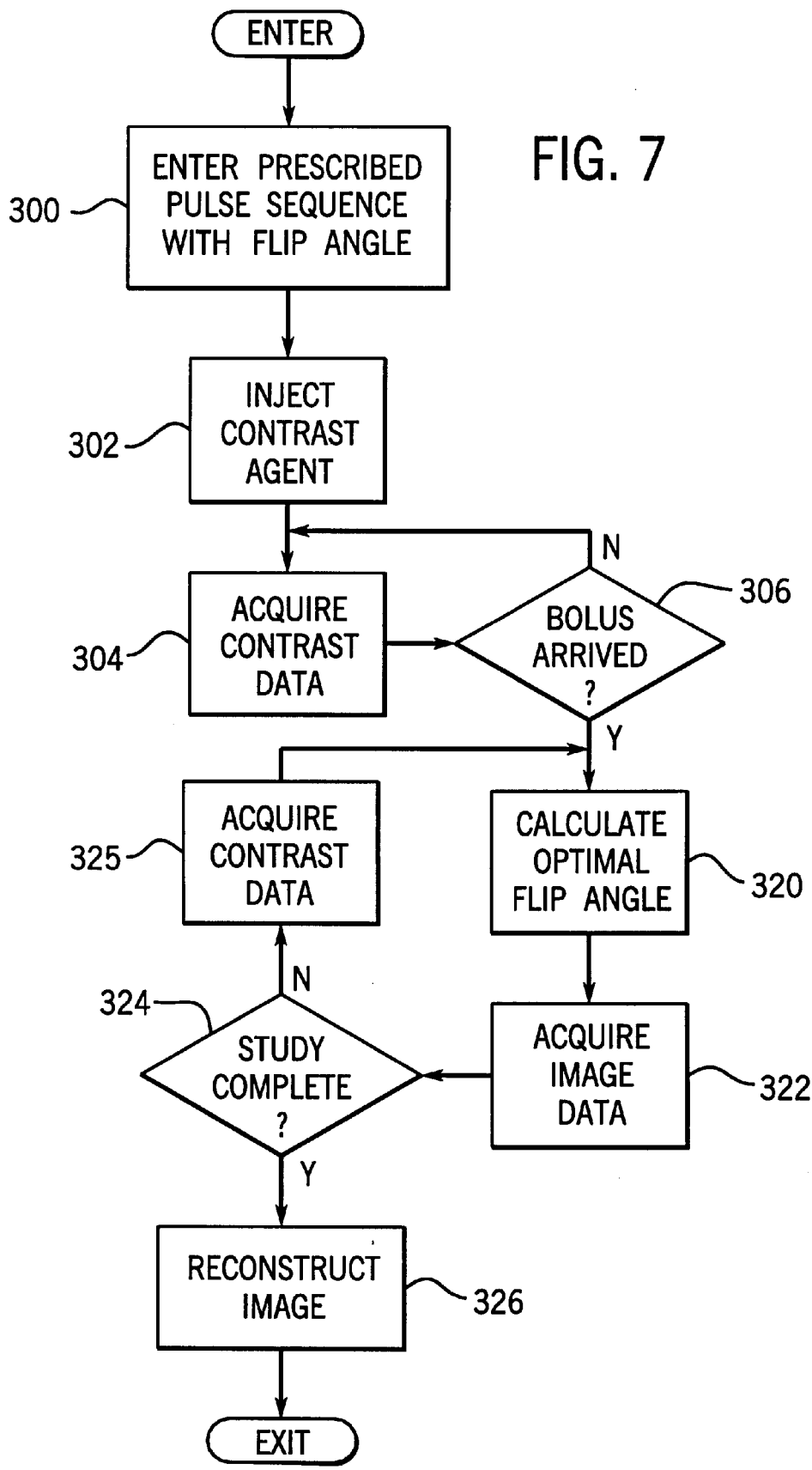
FIG. 7 is a flow chart of a first preferred embodiment of a method according to the present invention.

Referring particularly to FIG. 7, prior to the start of the dynamic study the operator enters the scan prescription parameters as indicated at process block 300. This includes defining the ROI and setting the flip angle of the rf excitation pulse. The contrast agent is then injected into the patient as indicated at process block 302, and the MRI system performs a contrast measurement pulse sequence to acquire NMR data as indicated at process block 304. This pulse sequence, which is shown in FIG. 8, acquires an NMR signal that is used to indicate the concentration of contrast agent in a well defined ROI. This pulse sequence is repeatedly performed until the measured concentration reaches a threshold level as determined at decision block 306.

As shown in FIG. 8, the contrast concentration pulse sequence is commercially available on the General Electric MRI system as part of the Smart Prep feature. It includes a 90° rf excitation pulse 308 which is applied in the presence of a slice select gradient pulse 310, followed by a 180° rf refocusing pulse 312 applied in the presence of a second slice select gradient pulse 314. The first and second slice select gradients 310 and 314 are directed along orthogonal axes (e.g. z and y axes) and they intersect in the ROI. An NMR signal 316 is acquired in the presence of a readout gradient pulse 318, and the acquired NMR signal is integrated and stored as a concentration value. Prior to acquisition a calibration table of signal enhancement as a function of contrast agent concentration is measured and stored. This "look-up" table is then used repeatedly for subsequent scans with the same pulse sequence. During the initial acquisition, before the arrival of contrast, a baseline concentration value is established and stored. This baseline concentration value is used to normalize the concentration values measured during the dynamic study. It is also used to establish the threshold concentration value which indicates arrival of the contrast bolus at decision block 306.

Referring again to FIG. 7, after the contrast bolus arrives, an optimal flip angle for the imaging pulse sequence is calculated at process block 320. Image data is then acquired using the pulse sequence of FIG. 3 as indicated at process block 322. The optimal flip angle ($\alpha_E$) is calculated using the above equations (1) and (2) and the most recent normalized contrast concentration (C) measurement. The system then loops back at decision block 324 to make another contrast concentration measurement, as indicated at process block 325, update the optimal flip angle at process block 320 and acquire more image data at process block 322. This acquisition continues until sufficient k-space data is acquired to reconstruct a 3D image as indicated at process block 326.

With this embodiment of the invention contrast concentration measurements are interleaved with the acquisition of the image data. This enables the optimal flip angle to be calculated and applied in real-time. While this provides a very accurate modulation of the flip angle during the dynamic study, the interleaved contrast concentration measurements require time and extend the length of the scan. It has been found that 200 views of image data can be acquired between each contrast concentration measurement with the result that the scan time is increased approximately 0.5%.

An alternative implementation of this embodiment of the invention employs the imaging pulse sequence of FIG. 3 to perform the contrast concentration measurement. In this case only a few views (e.g. one to six phase encodings) are acquired from the center of k-space using the 3 dfgre pulse sequence. The acquired NMR signals are reconstructed into a 3D image data set with high resolution in the readout direction and very low resolution in the phase encoding direction. Data is selected from this 3D image data set and integrated to provide an indication of contrast passage. The contrast measurement using this imaging pulse sequence is performed once per second. The imaging pulse sequence has a nominal TR of 5 msecs, which allows the acquisition of 200 imaging views between each contrast measurement.

Modulation of Flip Angle With Stored Model

It has been discovered that when imaging certain vascular structures, such as the carotid arteries, the contrast concentration profile C(t) is predictable in terms of its shape. The second technique for modulating the flip angle according to the present invention is to store a set of values in a table which model the predicted contrast concentration profile C(t) and then time the reading out of these values with the arrival of the contrast bolus. The stored values may represent contrast concentration which is used to calculate flip angle, or the stored values may be a table of calculated flip angles.

Figure 9:
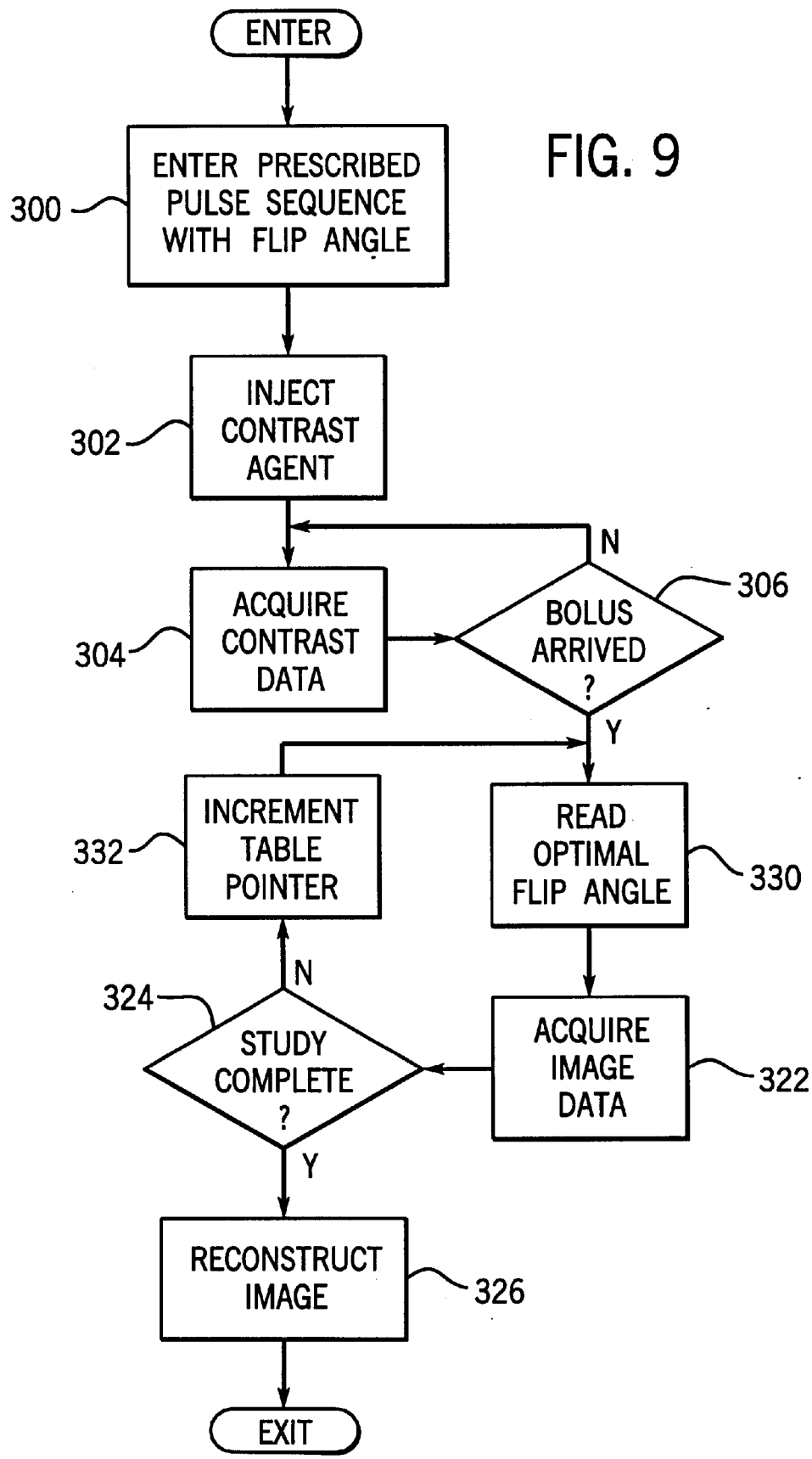
FIG. 9 is a flow chart of a second preferred embodiment of a method according to the present invention.

Referring particularly to FIG. 9, the steps for implementing the second embodiment of the invention are very similar to the first embodiment described above and identical blocks have been indicated with the same reference numbers. The system is configured and the patient is injected with contrast agent as indicated by process blocks 300 and 302. A loop in which contrast concentration data is acquired and compared with a threshold value is then entered as indicated by blocks 304 and 306. When the threshold concentration level is detected, image data acquisition is triggered and the first flip angle in the stored table is read out and down loaded to the pulse generator module 121 as indicated at process block 330. Image data is then acquired at process block 322 and the next optimal flip angle is read from the table after incrementing a pointer into the table, as indicated at process block 332. The stored table lists the optimal flip angles as a function of time and the pointer is an indication of the time since the detection of the bolus arrival.

What is claimed is:

1. A method for acquiring magnetic resonance angiography (MRA) data from a patient with a magnetic resonance imaging (MRI) system, the steps comprising:
    a) injecting the patient with a contrast agent;
    b) determining the concentration of contrast agent in a region of interest to be imaged;
    c) performing a series of imaging pulse sequences with the MRI system to acquire MRA data from the patient from which an image of the region of interest can be reconstructed; and
    d) modulating the flip angle of an rf excitation pulse used in the imaging pulse sequences such that the flip angle changes as a function of contrast agent concentration in the region of interest while performing step c).

2. The method as recited in claim 1 in which:
    contrast agent concentration is determined by performing a measurement pulse sequence with the MRI system periodically during the performance of step c) to measure the contrast agent concentration; and
    step d) is performed by calculating an optimal flip angle using the measured contrast agent concentration.

3. The method as recited in claim 2 in which the measurement pulse sequence is different from the imaging pulse sequence.

4. The method as recited in claim 2 in which the performance of the measurement pulse sequence is interleaved with the series of imaging pulse sequences.

5. The method as recited in claim 2 in which the optimal flip angle is the Ernst angle.

6. The method as recited in claim 2 in which the same pulse sequence is used for the measurement pulse sequence and the imaging pulse sequence.

7. The method as recited in claim 1 in which:
    contrast agent concentration is determined by determining a contrast concentration profile for vasculature in the region of interest and storing values in a table related thereto; and
    step d) includes reading successive stored values from the table and changing in response thereto the flip angle of the rf excitation pulses used during the performance of step c).

8. The method as recited in claim 7 in which the values stored in the table are flip angles.

9. A method for acquiring magnetic resonance angiography (MRA) data from a patient with magnetic resonance imaging (MRI) system, the steps comprising:

a) injecting the patient with a contrast agent;

b) determining the concentration of contrast agent in a region of interest to be imaged;

c) performing a series of imaging pulse sequences with the MRI system to acquire MRA data from the patient from which an image of the region of interest can be reconstructed; and d) modulating a scan parameter in the imaging pulse sequences such that the scan parameter changes as a function of contrast agent concentration in the region of interest while performing step c).

10. The method as recited in claim 9 in which contrast agent concentration is determined by performing a measurement pulse sequence with the MRI system periodically during the performance of step c); and step d) is performed by calculating a scan parameter using the most current measured contrast agent concentration.

11. The method as recited in claim 9 in which contrast agent concentration is determined by estimating a contrast concentration profile for vasculature in the region of interest and storing values in a table related thereto; and step d) includes reading successive stored values from the table and changing in response thereto the scan parameter during the performance of step c).

* * * * *

UNITED STATES PATENT AND TRADEMARK OFFICE
CERTIFICATE OF CORRECTION

PATENT NO. : 6,198,960 B1
DATED : March 6, 2001
INVENTOR(S) : Fain, et al.

It is certified that error appears in the above-identified patent and that said Letters Patent is hereby corrected as shown below:

<u>Column 1,</u>
Directly above "BACKGROUND OF THE INVENTION", please insert the following: under a separate heading of "Government License Rights"

" The U.S. Government has a paid-up license in this invention and the right in limited circumstances to require the patent owner to license others on reasonable terms as provided for by the terms of CA37993 awarded by the National Institutes of Health."

Signed and Sealed this

Fourteenth Day of August, 2001

*Attest:*

*Attesting Officer*

NICHOLAS P. GODICI
*Acting Director of the United States Patent and Trademark Office*